United States Patent
Amato

(10) Patent No.: US 7,427,857 B2
(45) Date of Patent: Sep. 23, 2008

(54) RESISTOR STRUCTURES TO ELECTRICALLY MEASURE UNIDIRECTIONAL MISALIGNMENT OF STITCHED MASKS

(75) Inventor: Joseph M Amato, Rochester, NY (US)

(73) Assignee: NXP B.V., Eindhoven (NL)

( * ) Notice: Subject to any disclaimer, the term of this patent is extended or adjusted under 35 U.S.C. 154(b) by 8 days.

(21) Appl. No.: 10/537,952

(22) PCT Filed: Dec. 4, 2003

(86) PCT No.: PCT/IB03/05645

§ 371 (c)(1), (2), (4) Date: Jun. 8, 2005

(87) PCT Pub. No.: WO2004/055599

PCT Pub. Date: Jul. 1, 2004

(65) Prior Publication Data

US 2006/0060843 A1 Mar. 23, 2006

Related U.S. Application Data

(60) Provisional application No. 60/433,311, filed on Dec. 13, 2002.

(51) Int. Cl.
    *G01R 31/28* (2006.01)
(52) U.S. Cl. .................................................. 324/158.1
(58) Field of Classification Search ......... 324/754–765, 324/158.1, 500, 537; 33/286, 533, 608, 616, 33/645, 677; 340/686.2; 356/400; 257/48; 438/18, 14
    See application file for complete search history.

(56) References Cited

U.S. PATENT DOCUMENTS

| 4,431,923 A |   | 2/1984 | Wang et al. |
| 5,383,136 A | * | 1/1995 | Cresswell et al. ............. 702/97 |
| 6,030,752 A | * | 2/2000 | Fulford et al. ............. 430/312 |
| 6,225,013 B1 |   | 5/2001 | Ayelet et al. |
| 6,393,714 B1 |   | 5/2002 | Look et al. |

\* cited by examiner

*Primary Examiner*—Jermele M. Hollington
*Assistant Examiner*—Tung X Nguyen
(74) *Attorney, Agent, or Firm*—Peter Zawilski

(57) ABSTRACT

An apparatus and method for matched variable resistor structures to electrically measure unidirectional misalignment of stitched masks for etched interconnect layers includes a first test pad and a second test pad for measuring resistance therebetween; a first resistive element electrically connected at a first end to the first test pad; and, a second resistive element electrically connected at a first end to the second test pad. The first resistive element and the second resistive element are electrically connected by a vertical offset. The resistance measured between the first test pad and the second test pad is variable in accordance with an alignment of the first resistive element and the second resistive element relative to the vertical offset. An indicator may optionally provide an indication that the resistive elements are in alignment.

8 Claims, 2 Drawing Sheets

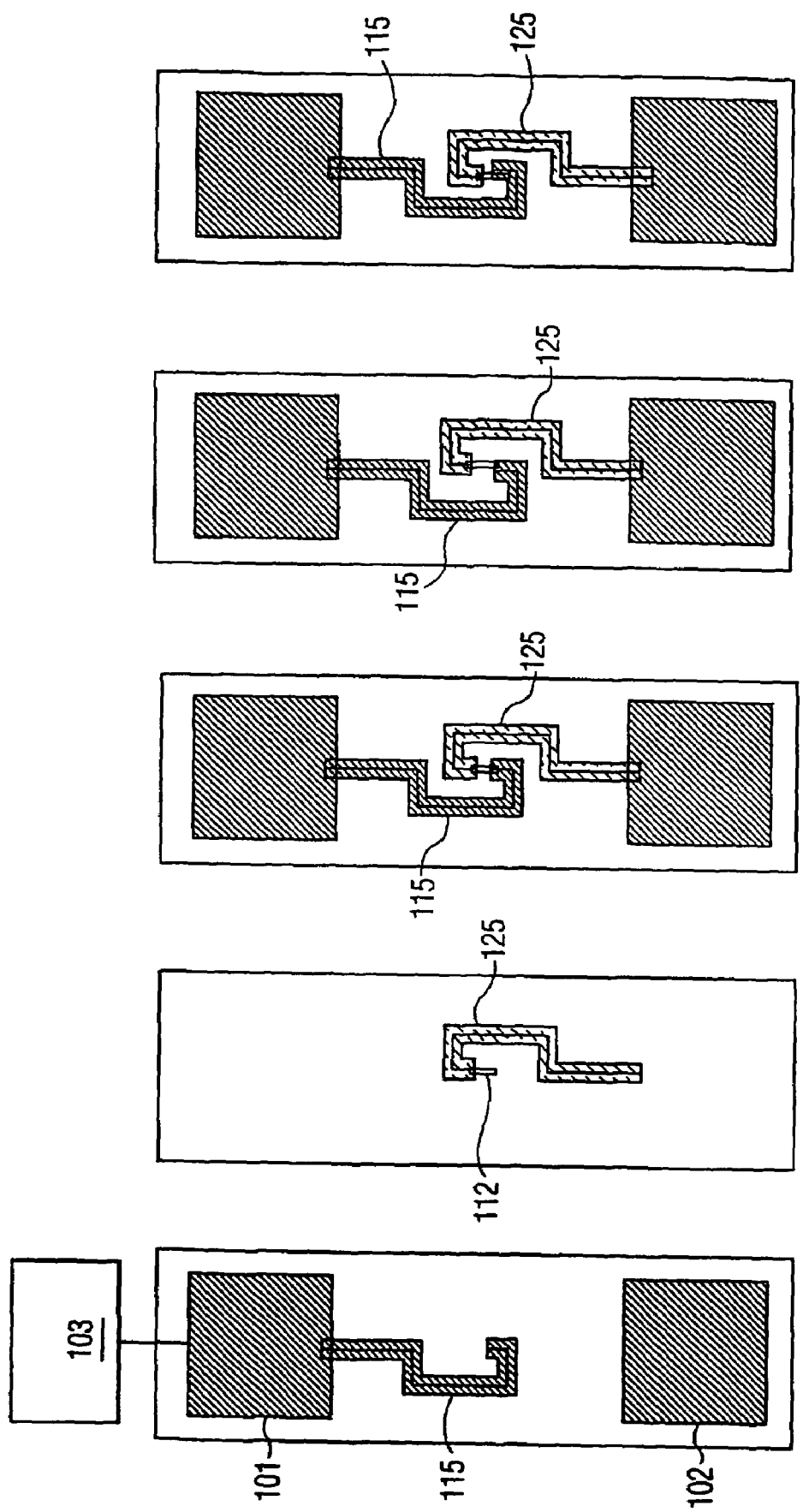

RESISTOR STRUCTURES TO ELECTRICALLY MEASURE UNIDIRECTIONAL MISALIGNMENT OF STITCHED MASKS

CROSS REFERENCE TO RELATED APPLICATION

This application claims the benefit of U.S. provisional application Ser. No. 60/433,311 filed 13 Dec. 2002, which is incorporated herein by reference.

1. The present invention relates to matched resistors structures. More particularly, the present invention relates to the measurement of unidirectional misalignment of stitched masks for etched interconnect layers.

2. In prior art, the techniques to measure stitching offsets normally use an optical means to detect variations in stitching. For example, U.S. Pat. No. 4,431,923 to Wang et al. discloses a process for accurately aligning a chosen member with a focused beam of radiation or for aligning two chosen members with each other. A set of alignment marks having a predetermined spatial pattern is first provided on the surface of each member. Next, a detection signal is generated from the set of alignment marks, comprising a serial electronic signal as a function of time and containing serial information corresponding to the relative position of each mark in the set of alignment marks. Then, the detection signal is electronically processed to generate an alignment signal with a high signal-to-noise ratio. Next, the alignment signal is compared to a reference signal signifying a predetermined criterion of alignment, to generate an error signal which is indicative of the extent of misalignment. Finally, lateral movement of one chosen member is produced in response to the error signal until accurate alignment of the chosen member with the focused beam of radiation or of the two chosen members with each other is achieved.

It is also known in the art that the resistance of an IC interconnect is measured in squares, and that narrower segments are more resistive for a given length. It is also known that stitching can cause uncertainties due to mask alignments.

The present invention is directed to a method and apparatus for isolating offset detection of etched resistors of a stitched mask set by using mask misalignment for the variable resistor. For example, when a first mask of a first structure and a second mask of a second structure are aligned, the structures have the same resistance value as there is no offset on the secondary mask of a stitched mask set. However, when an offset occurs, one structure's resistance will decrease by the same value as the other structure's resistance increases.

FIGS. 1F and 1G illustrate another embodiment of the present invention, wherein the components overlap.

FIG. 1H shows the components of FIGS. 1F and 1G superimposed, wherein the two components are joined together and in alignment.

FIG. 1I shows a stitched mask set having components that are misaligned in a first direction relative to a vertical offset.

FIG. 1J shows a stitched mask set having components that are misaligned in a second direction relative to a vertical offset.

In the following description, for purposes of explanation rather than limitation, specific details are set forth such as the particular architecture, interfaces, techniques, etc., in order to provide a thorough understanding of the present invention. However, it will be apparent to those skilled in the art that the present invention may be practiced in other embodiments, which depart from these specific details. Moreover, for the purpose of clarity, detailed descriptions of well-known devices, circuits, and methods are omitted so as not to obscure the description of the present invention with unnecessary detail.

Figure 1E:
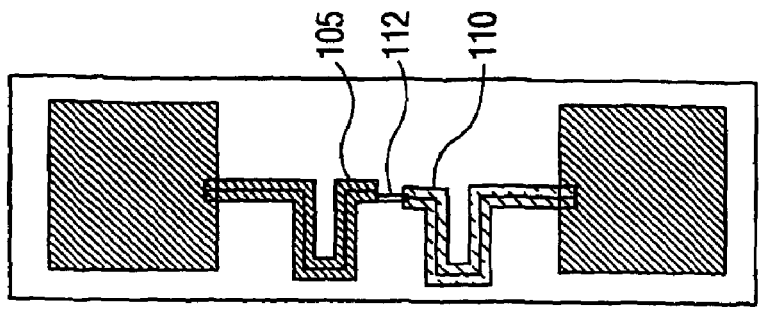
FIG. 1E illustrates the stitched mask set having components that are misaligned in a second direction relative to a vertical offset.
Figure 1D:
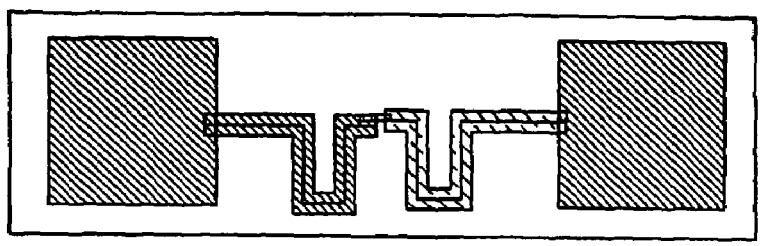
FIG. 1D illustrates the stitched mask set having components that are misaligned in first direction relative to a vertical offset.
Figure 1C:
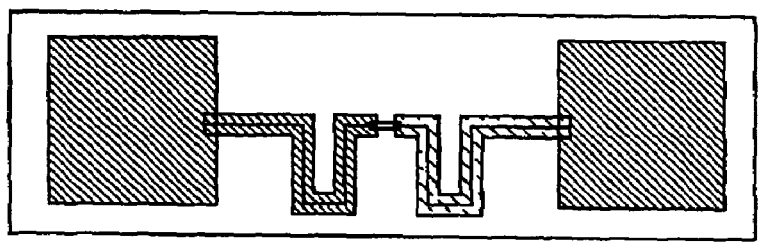
FIG. 1C illustrates a superimposed view of FIGS. 1A and 1B so that the two components are joined together and are in alignment.
Figure 1B:
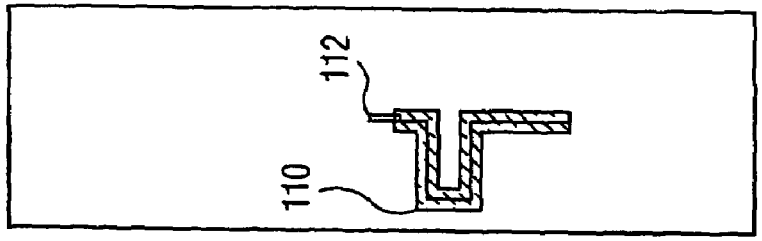
FIGS. 1A and 1B illustrate respective resistive components of a stitched mask set prior to being joined together.
Figure 1A:
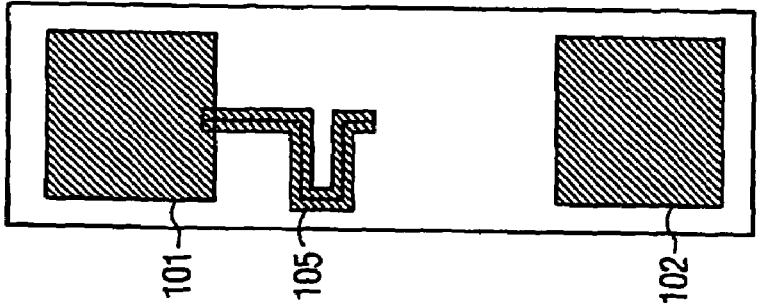

FIG. 1A shows a first test pad 101 and a second test pad 102 that are used for aligning the etched resistor structures 105, 110 (shown in FIG. 1B) according to a first aspect of the present invention. The desired effect is to superimpose FIGS. 1A and 1B so as to make one resistor structure that is electrically connected by vertical offset 112.

The geometry of the structure isolates the offset direction and may cause the resistance between the test pads to decrease proportionally or increase proportionally. For example, as shown in FIG. 1D, the resistance between the test pads will decrease proportionally to the vertical offset 112. Similarly, if the misalignment occurs as in FIG. 1E, the vertical offset 112 between the resistor structures is longer and the resistance between the test pads will increase proportionally.

With regard to FIGS. 1F through 1J, it can be seen that the resistive elements 115, 125 are designed so that there is some degree of overlap of the paths when the elements are joined together.

FIGS. 1F and 1G can have their masks superimposed so as to create the condition shown in FIG. 1H, wherein the resistance at the test pads is at a lowest level. If the mask 125 is misaligned as shown in 1I, the resistance between the pads will increase proportionally to the vertical offset. Conversely, if the mask 125 is misaligned as shown in FIG. 1J, the resistance between the test pads will decrease proportionately.

A method for testing the aligning the etched stitch masks would be to first connect a first stitched resistor 105 to a first test pad 101. A second stitched resistor 110 having a vertical offset connection 112 would be connected to an end of the first stitched resistor, preferably so that the first and second stitched resistors are vertically aligned relative to the offset. At this step the resistance would either be measured or displayed. In the case that the resistor structures are in alignment, there would be a predetermined resistance amount from which it would be ascertained that the placement is correct. A indicator signal 103, such as a green light, would indicate that no further alignment is required.

If there is a misalignment, a color indication, such as a red light, could turn on to signify a misalignment. It should be understood that the signals do not have to be colors, they could be sounds or values displayed on the test pad (in ohms, for example) could be substituted. Also voice instructions, in addition to the visual cues, or in place thereof, could easily be used in place thereof or in addition thereto.

The structure geometries isolate the offset direction. In addition, the structures are chosen such that at ideal alignment (zero offset) the resistance of structures shown in FIGS. 1C and 1H will be equal, due to having the same number of turns, the same length of wide interconnect and the same length of the narrow interconnect. Also, one could actually receive a desired resistance between two joined structures of unequal resistance by intentional misaligning. Thus, an accurate measurement can be made without introducing expensive optical systems into use. Once the resistance measurements are determined to be within a predetermined range, the masks can then be used, or alternatively, if they are outside the predetermined range, the item could be flagged as defective.

While the preferred embodiments of the present invention have been illustrated and described, it will be understood by those skilled in the art that various changes and modifications may be made, and equivalents may be substituted for elements thereof without departing from the true scope of the present invention. In addition, many modifications may be made to adapt to a particular situation and the teaching of the present invention without departing from the central scope. Therefore, it is intended that the present invention not be limited to the particular embodiment disclosed as the best mode contemplated for carrying out the present invention, but that the present invention includes all embodiments falling within the scope of the appended claims.

The invention claimed is:

1. An apparatus for electrical measurement of an alignment of stitched masks, comprising:
    a first test pad and a second test pad for measuring resistance therebetween;
    a first resistive element electrically connected at a first end to the first test pad;
    a second resistive element electrically connected at a first end to the second test pad;
    said first resistive element and said second resistive element electrically connected by a vertical offset;
    wherein the resistance measured between the first test pad and the second test pad is variable in accordance with an alignment of the first resistive element and the second resistive element relative to the vertical offset.

2. The apparatus according to claim 1, wherein the resistance measured between the first test pad and the second test pad decreases when the first resistive element and the second resistive element are misaligned in a first position.

3. The apparatus according to claim 1, wherein the resistance measured between the first test pad and the second test pad increases when the first resistive element and the second resistive element are misaligned in a second position, opposite to the first position.

4. The apparatus according to claim 1, wherein when the first resistive element and the second resistive element are in substantial alignment, a resistance measurement of the resistive elements is approximately equal.

5. The apparatus according to claim 1, wherein the first resistive element and the second resistive element are etched into respective masks that are superimposed to connect to each other.

6. The apparatus according to claim 1, wherein a second portion of the first resistive element and a second portion of the second resistive element at least partially overlap each other.

7. The apparatus according to claim 1, further comprising means for displaying a resistance measured between the test pads.

8. The apparatus according to claim 1, further comprising sound means that varies in pitch in accordance with a resistance measured between the pads.

* * * * *